(12) United States Patent
Hegele (10) Patent No.: US 12,038,695 B2
(45) Date of Patent: Jul. 16, 2024

(54) PROTECTION DEVICE FOR LINES IN A PROJECTION PRINTING INSTALLATION FOR SEMICONDUCTOR LITHOGRAPHY

(71) Applicant: Carl Zeiss SMT GmbH, Oberkochen (DE)

(72) Inventor: Tobias Hegele, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 105 days.

(21) Appl. No.: 17/370,391

(22) Filed: Jul. 8, 2021

(65) Prior Publication Data
US 2021/0336429 A1 Oct. 28, 2021

Related U.S. Application Data

(63) Continuation of application No. PCT/EP2019/084353, filed on Dec. 10, 2019.

(30) Foreign Application Priority Data

Jan. 15, 2019 (DE) .......................... 102019200388.5

(51) Int. Cl.
*G03F 7/00* (2006.01)
*H02G 3/04* (2006.01)
*H02G 11/00* (2006.01)

(52) U.S. Cl.
CPC ...... *G03F 7/70991* (2013.01); *G03F 7/70841* (2013.01); *G03F 7/709* (2013.01); *H02G 3/0468* (2013.01); *H02G 11/00* (2013.01)

(58) Field of Classification Search
CPC .. G03F 7/709; G03F 7/70991; G03F 7/70775; G03F 7/708–70841;
(Continued)

(56) References Cited

U.S. PATENT DOCUMENTS

| 5,105,054 A | * | 4/1992 | Kirma | .................. H02G 3/0468 |
| | | | | 174/72 A |
| 2003/0137643 A1 | * | 7/2003 | Jacobs | ................ G03F 7/70991 |
| | | | | 355/53 |

(Continued)

FOREIGN PATENT DOCUMENTS

| DE | 10 2010 002 040 A1 | 10/2010 |
| DE | 10 2016 217 285 A1 | 3/2018 |

(Continued)

OTHER PUBLICATIONS

Translation of International Search report for corresponding PCT Appl No. PCT/EP2019/084353, dated Feb. 20, 2020.

(Continued)

*Primary Examiner* — Christina A Riddle
(74) *Attorney, Agent, or Firm* — Fish & Richardson P.C.

(57) ABSTRACT

A protective apparatus for lines between two components of a projection exposure apparatus for semiconductor lithography is firmly connected to the two components. the protective apparatus includes first and second partial regions which are configured to protect against mechanical damage to the lines. The first partial region is at least temporarily configured to mechanically decouple the first component from the second component.

19 Claims, 5 Drawing Sheets

(58) Field of Classification Search
CPC ............. G03F 7/70858; G03F 7/70908; G03F 7/70916; G03F 7/7095; G03F 7/70975; H02G 3/0468; H02G 3/0462; H02G 11/00; F16L 11/00; F16L 11/08; F16L 11/10; F16L 11/11; F16L 11/112; F16L 11/115; H01B 7/0045; H01B 7/17; H01B 7/18–1815; H01B 7/1875; H01B 7/20
USPC ..................... 355/18, 30, 52–55, 67–77, 133
See application file for complete search history.

(56) References Cited

U.S. PATENT DOCUMENTS

| | | | |
|---|---|---|---|
| 2004/0051767 A1* | 3/2004 | Takano | B41J 2/175 347/94 |
| 2008/0035372 A1 | 2/2008 | Butler et al. | |
| 2010/0096512 A1* | 4/2010 | Krastev | G03F 7/70991 248/65 |
| 2010/0181760 A1* | 7/2010 | Duquette | F16L 25/0045 285/330 |
| 2010/0238424 A1* | 9/2010 | Van Empel | G03F 7/70725 425/150 |
| 2011/0149264 A1* | 6/2011 | Damen | H01R 12/592 29/857 |
| 2013/0314771 A1* | 11/2013 | Geuppert | G03F 7/709 359/872 |
| 2015/0014904 A1* | 1/2015 | Tirelli | F16F 15/04 267/140.2 |
| 2016/0052468 A1* | 2/2016 | Kanagawa | H01R 4/72 174/68.3 |
| 2019/0196343 A1* | 6/2019 | Horn | G03F 7/70941 |

FOREIGN PATENT DOCUMENTS

| | | |
|---|---|---|
| JP | 2002-027649 A | 1/2002 |
| WO | WO 2018/046597 | 3/2018 |

OTHER PUBLICATIONS

German Office Action, with translation thereof, for corresponding DE Appl No. 10 2019 200 388.5, dated Aug. 26, 2019.

* cited by examiner

PROTECTION DEVICE FOR LINES IN A PROJECTION PRINTING INSTALLATION FOR SEMICONDUCTOR LITHOGRAPHY

CROSS-REFERENCE TO RELATED APPLICATIONS

The present application is a continuation of, and claims benefit under 35 USC 120 to, international application PCT/EP2019/084353, filed Dec. 10, 2019, which claims benefit under 35 USC 119 of German Application No. 10 2019 200 388.5, filed Jan. 15, 2019. The entire disclosure of these applications are incorporated by reference herein.

FIELD

The application relates to a protective apparatus for lines in a projection exposure apparatus for semiconductor lithography.

BACKGROUND

Energy, signals and other supply media are exchanged between the components of a projection exposure apparatus in semiconductor technology via lines, whereby the subsystems are connected to one another. These lines typically run inside protective apparatuses so as to prevent the lines from sustaining damage during the transport and the assembly process. Especially optical waveguides for transmitting optical signals are desirably protected against mechanical effects from the outside, such as due to collision with tools or with structural parts of the components, and against the bend radius falling below the minimum bend radius.

The lines in the protective apparatuses represent a mechanical connection between the components that can also transmit undesirable mechanical vibrations. For this reason, the protective apparatuses are desirably embodied such that they transfer minimal static and dynamic stiffnesses from one component to a component connected thereto, that is to say maximally decouple the components from one another. The static stiffness together with a deflection results in a force that acts on the two components in the case of a relative movement between the two components. The dynamic stiffness describes the frequency-dependent stiffness of a body that has influence on the controllability of components. The protective apparatuses in known systems can be embodied, for example, in the form of corrugated tubes of steel arranged in an arc between two components or subsystems. The corrugated tubes offer sufficient mechanical protection and, with a corresponding design, can also safeguard against a bend radius falling below the minimum bend radius of optical waveguides. These can have a static and dynamic stiffness that is too high for the increased desired performance characteristics in the most recent generations of projection exposure apparatuses. Alternative plastic tubes that meet the desired performance characteristics regarding static and dynamic stiffness can have a tendency to outgas excessively and/or do not offer protection with respect to the bend radius being too low and are therefore not suitable for use in a projection exposure apparatus.

SUMMARY

The present disclosure seeks to provide an apparatus that reduced, and possibly avoid, limitations of known apparatuses.

A protective apparatus according to the disclosure for lines between two components of a projection exposure apparatus for semiconductor lithography, wherein the protective apparatus is firmly connected to the two components, includes at least one first partial region and at least one second partial region, wherein the first partial region and the second partial region are formed to protect against mechanical damage to the lines. The first partial region is here configured at least temporarily for the mechanical decoupling between the first and second components.

The lines that are protected against mechanical damage by the protective apparatus at each point in time, wherein the bend radius falling below a minimal bend radius is also considered to be mechanical damage, can be embodied in the form of electrical conductors or optical guides, such as optical waveguides, or other supply lines for fluids. The decoupling effect of the first partial region may not exist at specific points in time, such as during the transport of the connected components, which in turn can improve the protection against mechanical damage during transport, since smaller relative movements of the lines are possible and in this way for example impact of the lines in the protective apparatus can be avoided. The second partial region can be embodied for example in the form of a corrugated tube or of a bent steel tube.

In one variant of the disclosure, the second partial region can include multiple segments. The segments are sections of the partial region that are not directly linked to one another and that have the same function, such as protection against mechanical damage and flexibility. They frequently have nearly identical constructions, for example all segments of the second partial region can be embodied in the form of corrugated tube or of steel tube, wherein a combination of corrugated tube and steel tube is also conceivable. These segments can have only little or no decoupling properties. For example, a first partial region of the protection apparatus can be arranged between the segments.

For example, the segments of the second partial region can be designed to exhibit different lengths. Mechanical vibrations corresponding to the frequency of the eigenmodes or resonances of the segments can be strongly transmitted thereby, wherein the eigenmodes depend, inter alia, on their lengths. If the segments of the second partial region have different lengths, the mechanical vibrations of a first segment can be transmitted further by the second segment only in a damped manner, because they do not excite the second segment in the eigenmodes which are different from the first segment. Forming the segments to have different lengths can result in a reduction in the amplitudes for specific frequencies.

The first partial region can furthermore be firmly connected to at least one segment of the second partial region.

For example, the connection between the first partial region and the at least one segment of the second partial region can be a clamping connection. Clamping apparatuses can also be used to attach the protective apparatus to the components, that is to say between a component and a first partial region, and a component and a second partial region, wherein screw connections or simple plug-in connections are also conceivable.

In one variant of the disclosure, the first partial region can be connected in a first and in a second position to the at least one segment of the second partial region. The two partial regions are thus arranged such that they are movable relative to each other.

For example, the first partial region in the first position can firmly connect two segments of the second partial region to one another or one segment of the second partial region to at least one of the two components. The first partial region can here include an attachment mechanism and a sleeve, wherein the attachment mechanism is embodied for connecting to the segments of the second partial region or the components, whereas the sleeve has no direct connection to the segments of the second partial region or the components but can at least nearly completely enclose them. In this first position, it is possible, if the second partial region includes two segments, for two segments of the second partial region to be connected to each other using the attachment mechanism in a manner such that no relative movement between the segments of the second partial region, which are embodied for example in the form of steel tubes, is possible anymore. If the second partial region includes only one segment, the first partial region can connect the segment of the second partial region to one of the two components, wherein a relative movement in this first position is likewise not possible.

The first partial region in the second position can furthermore be firmly connected to a segment of the second partial region or the component. The first partial region may be connected in this case to only one of the parts mentioned, with the result that, in this position, there is no connection between the two segments or between the segment of the second partial region and the component, and a relative movement between the two segments of the second partial region or the segment of the second partial region and the component is possible. Decoupling between the two components can be achieved in this way. The sleeve of the first partial region can in this second position be positioned such that the region of the lines that is not enclosed by the second partial region of the protective apparatus may be enclosed by the sleeve with some distance. In this way, the protection against mechanical damage exists even in this region.

The first position can be used, for example, for the transport of the components and during assembly of the projection exposure apparatus, wherein, once assembly is complete, the first partial region is slid from the first into the second position and in this way nearly complete decoupling of the two components with respect to one another can be ensured, which components are now firmly connected to one another only by way of the lines themselves.

In one variant of the disclosure, the ratio of the static stiffness of the first partial region and of the second partial region can be greater than 1. The static stiffness together with the deflection results in a force that acts on the two components in the case of a relative movement between the two components, whereby a movement can be transferred from one component to the other component. The lower the static stiffness is, the lower are the forces that are transferred at the same deflection. By selecting the static stiffness of the first partial region, it is also possible for example to ensure that the desired minimum bend radii are observed.

In addition, the ratio of the dynamic stiffness of the first partial region and of the second partial region in a frequency range of 500 Hz-2000 Hz can be less than 1/10. The dynamic stiffness describes the frequency-dependent stiffness of a body that has influence on the controllability of components over a specific frequency range.

Furthermore, the first partial region can include a material having inherent damping of more than 20%. This can be, for example, a plastic, such as a perfluoroelastomer, which is also known as FFKM or FKM. The perfluoroelastomer has a very low outgassing rate and is therefore suitable to be used in a vacuum.

In one variant of the disclosure, the first partial region can include multiple segments. All the segments of the first partial region can contribute to the decoupling overall effect of the first partial region. The segments can include in this case for example a bushing and two attachment mechanisms. The bushing can be made from perfluoroelastomer, as a result of which the bushing has inherent damping, in other words can convert kinetic energy in the material into thermal energy, and in this way additionally dampens the transmission of mechanical energy. The perfluoroelastomer can be sufficiently flexible to allow bending in the protective apparatus, yet can be sufficiently stiff to safeguard against a bend radius that is too small. The attachment mechanisms can serve to connect the bushing to a segment of the second partial region or to one of the two components.

The components and the segments of the first and second partial regions can furthermore be arranged successively as follows:

first component, segment of the first partial region, segment of the second partial region, second component or first component, segment of the second partial region, segment of the first partial region, second component or first component, first segment of the first partial region, segment of the second partial region, second segment of the first partial region, second component or first component, first segment of the first partial region, first segment of the second partial region, second segment of the first partial region, second segment of the second partial region, third segment of the first partial region, second component or first component, first segment of the first partial region, first segment of the second partial region, second segment of the first partial region, second segment of the second partial region, second component or first component, first segment of the second partial region, first segment of the first partial region, second segment of the second partial region, second segment of the first partial region, second component or first component, first segment of the second partial region, segment of the first partial region, second segment of the second partial region, second component.

With a larger number of segments of the first and second partial regions, further arrangements are possible. For example, the first partial region can be embodied in the form of a tuned mass damper. If the protective apparatus is formed in a sling from one component to the other component and is arranged for example at the lowest point of the sling, the point can be designed such that it dampens movements of the sling owing to the movement of an additional mass.

Furthermore, the materials of the protective apparatus can be vacuum-suitable, that is to say have low outgassing rates. This makes possible the use in projection exposure apparatuses of the latest generation, which are typically operated under vacuum.

BRIEF DESCRIPTION OF THE DRAWINGS

Exemplary embodiments and variants of the disclosure are explained in more detail below with reference to the drawing, in which.

DESCRIPTION OF EXEMPLARY EMBODIMENTS

Figure 1:
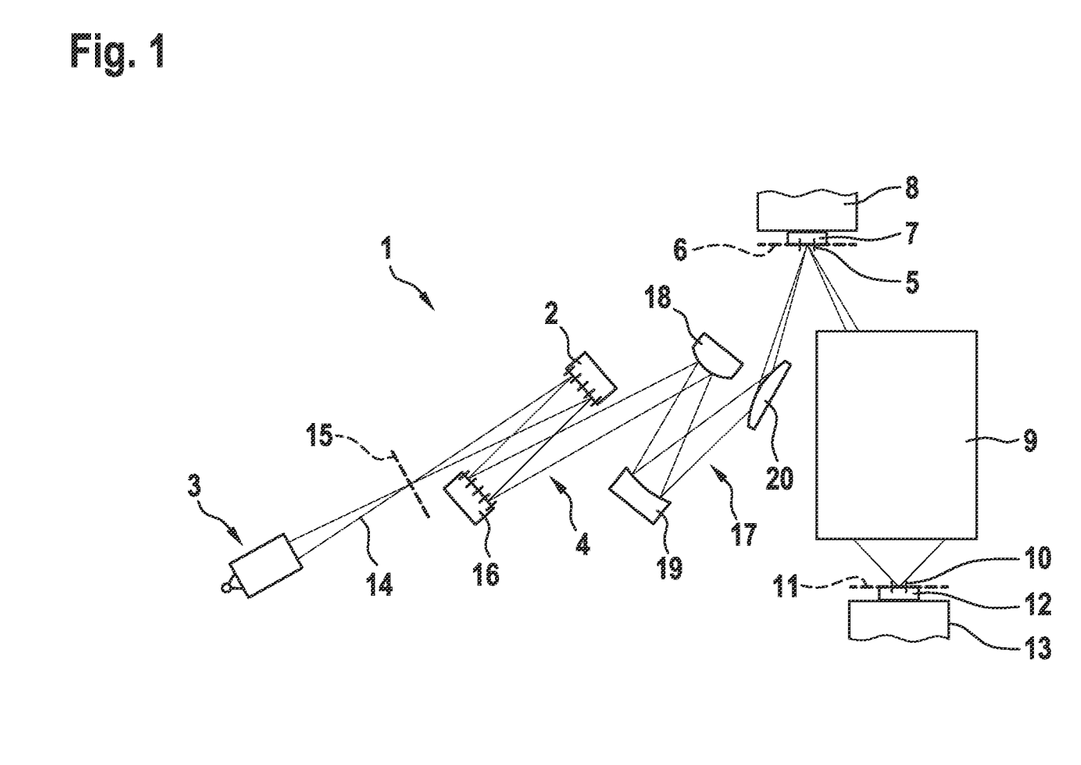
FIG. 1 shows the basic construction of an EUV projection exposure apparatus in which the disclosure can be implemented.

FIG. 1 shows by way of example the basic construction of a microlithographic EUV projection exposure apparatus 1 in which the disclosure can find application. The protective apparatus can be arranged for example between a controller (not illustrated) and the projection optical unit 9. An illumination system of the projection exposure apparatus 1 has, in addition to a light source 3, an illumination optical unit 4 for the illumination of an object field 5 in an object plane 6. EUV radiation 14 in the form of optical used radiation generated by the light source 3 is aligned via a collector, which is integrated in the light source 3, in such a way that it passes through an intermediate focus in the region of an intermediate focal plane 15 before it is incident on a field facet mirror 2. Downstream of the field facet mirror 2, the EUV radiation 14 is reflected by a pupil facet mirror 16. With the aid of the pupil facet mirror 16 and an optical assembly 17 having mirrors 18, 19 and 20, field facets of the field facet mirror 2 are imaged into the object field 5.

A reticle 7 arranged in the object field 5 and held by a schematically illustrated reticle holder 8 is illuminated. A merely schematically illustrated projection optical unit 9 serves for imaging the object field 5 into an image field 10 in an image plane 11. A structure on the reticle 7 is imaged onto a light-sensitive layer of a wafer 12, which is arranged in the region of the image field 10 in the image plane 11 and held by a likewise partly represented wafer holder 13. The light source 3 can emit used radiation for example in a wavelength range of between 5 nm and 120 nm.

The disclosure can likewise be used in a DUV apparatus, which is not illustrated. A DUV apparatus is set up in principle like the above-described EUV apparatus 1, wherein mirrors and lens elements can be used as optical elements in a DUV apparatus and the light source of a DUV apparatus emits used radiation in a wavelength range of 100 nm to 300 nm.

For example, the disclosure can also find application between components of which one is arranged at what is known as a force frame and the other is arranged at what is known as a sensor frame. The force frame is a carrying structure of a projection exposure apparatus absorbing forces emanating from the components used, for example their weights. The sensor frame, by contrast, substantially carries only sensor components and are desirably decoupled from mechanical influences of the force frame as much as possible in order to ensure for example position measurements that are as precise as possible.

Figure 2:
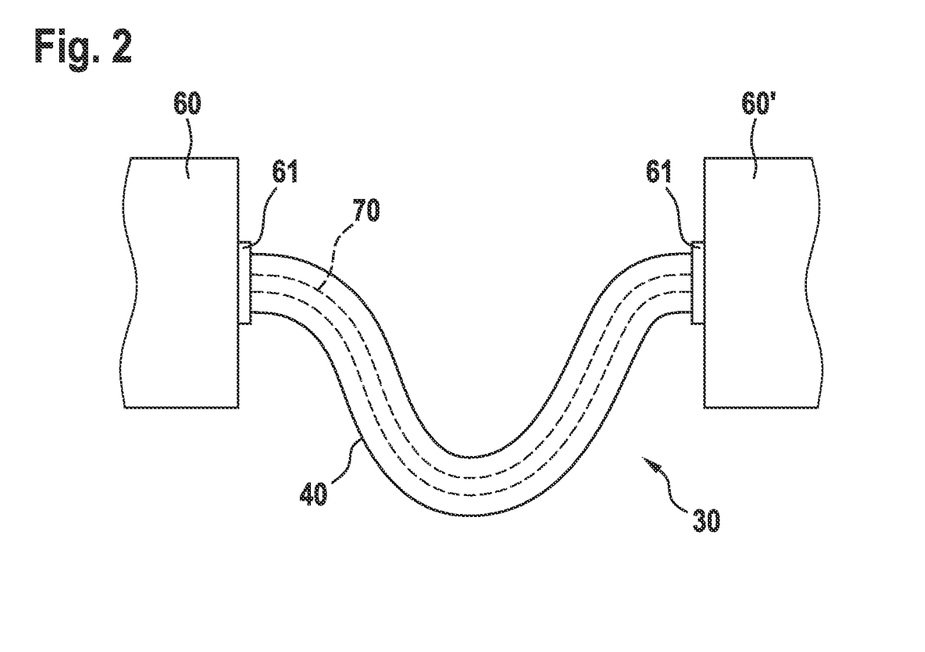
FIG. 2 shows a protective apparatus known from the prior art.

FIG. 2 shows a protective apparatus 30 known from the prior art, including a corrugated tube 40 and two attachment mechanisms 61. The protective apparatus 30 is attached by way of the attachment mechanisms 61 in each case to one of the two components 60, 60', wherein the protective apparatus 30 extends in a sling (not denoted separately in the figure) from one component 60 to the other component 60'. The sling serves to decouple relative movements between the two components 60, 60', wherein mechanical vibrations can be transmitted from one component 60 to the other component 60' via the corrugated tube 40. The lines 70 protected by the protective apparatus 30 against mechanical damage are indicated by dashed lines.

Figure 3:
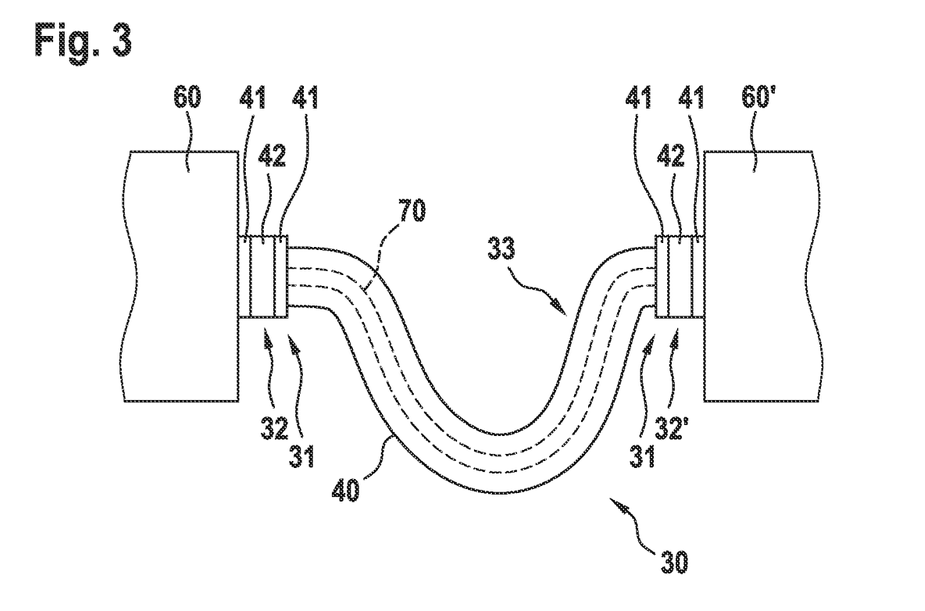
FIG. 3 shows a first embodiment of the disclosure.

FIG. 3 shows a schematic illustration of a first variant of the disclosure, wherein the protective apparatus 30 has a first partial region 31, including two segments 32, 32', and a second partial region 33 in the form of a corrugated tube 40. A segment 32, 32' of the first partial region 31 here includes a bushing 42 and two attachment mechanisms 41. The attachment mechanisms 41 connect the bushing 42 in each case to the second partial region 33 and to one of the two components 60, 60'. The bushing 42 can include plastic, for example, perfluoroelastomer. First, the flexibility, or low stiffness, of the bushing 42 compared to the second partial region 33 results in decoupling between the two components 60, 60', and, second, the energy, which is present in the system in the form of mechanical vibration energy, is reduced owing to the inherent damping of the bushing 42. The design of the corrugated tube 40 is nearly identical to the prior art shown in FIG. 2, wherein even the sling for further decoupling is kept. The lines 70 are again indicated by dashed lines.

FIGS. 4A-4D show different variants of a protective apparatus 30 according to the disclosure, wherein the protective apparatuses 30 are illustrated in each case without the sling to simplify the illustration. The segments 32, 32', 32" of the first partial region 31 are substantially identical to the segments 32, 32' shown in FIG. 3 and each include a bushing 42 and two attachment mechanisms 41.

Figure 4A:
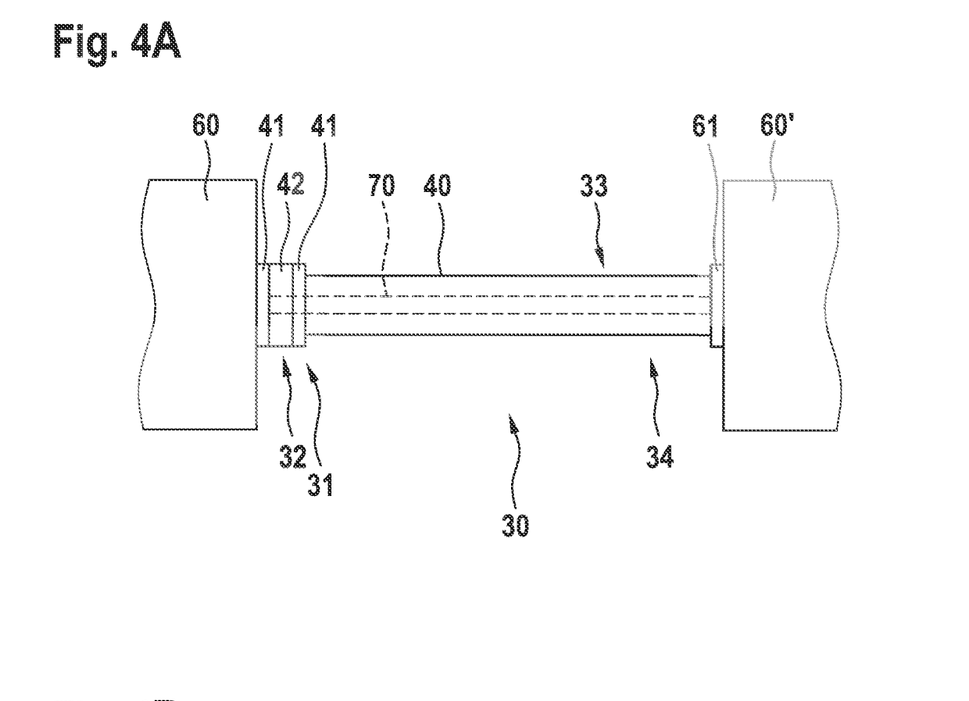
FIGS. 4A-4D show further variants of the first embodiment of the disclosure.

FIG. 4A shows a first variant of the protective apparatus 30, in which the first partial region 31 includes only one segment 32. In this case, the first attachment mechanism 41 connects the bushing 42 to the component 60, and the second attachment mechanism 41 again connects the bushing 42 to the second partial region 33, which likewise has only one segment 34. The segment 34 is connected to the component 60' by way of an attachment mechanism 61. The decoupling effect of the first partial region 31 is nearly identical to the one described in FIG. 3.

Figure 4B:
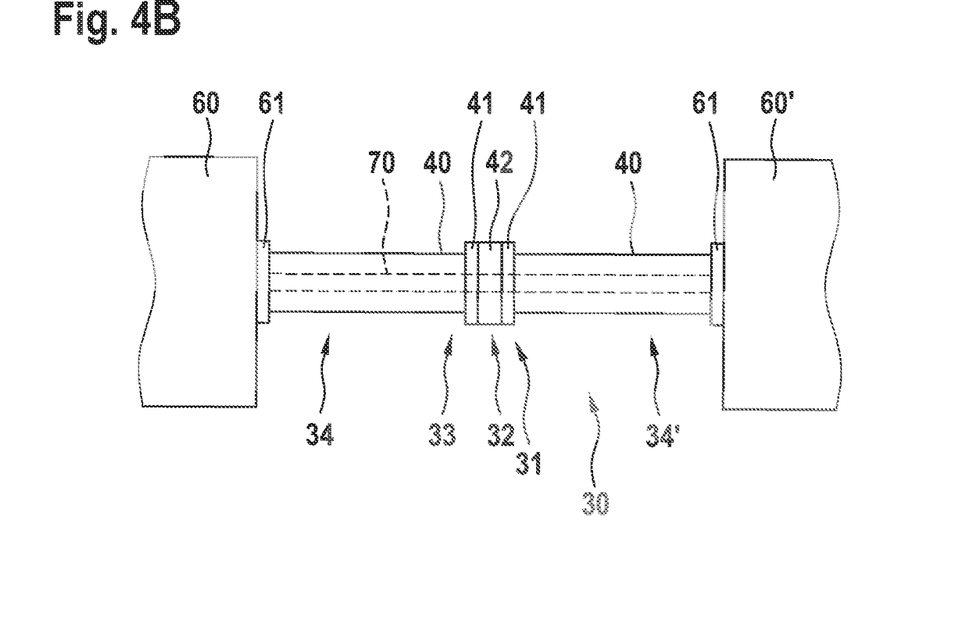

FIG. 4B shows a further variant of the protective apparatus 30, wherein the first partial region 31 likewise has only one segment 32. The latter is arranged between two segments 34, 34' of the second partial region 33. The segments 34, 34' are connected to the components 60, 60' using attachment mechanism 61. In this arrangement it is conceivable to embody the first partial region 31 additionally as a tuned damper. In this case, in addition to the inherent damping and decoupling of the bushing 42 as a whole, the first partial region 31 acts as an absorber, which can reduce the amplitudes in a resonant frequency of the protective apparatus 30 to a minimum.

Figure 4C:
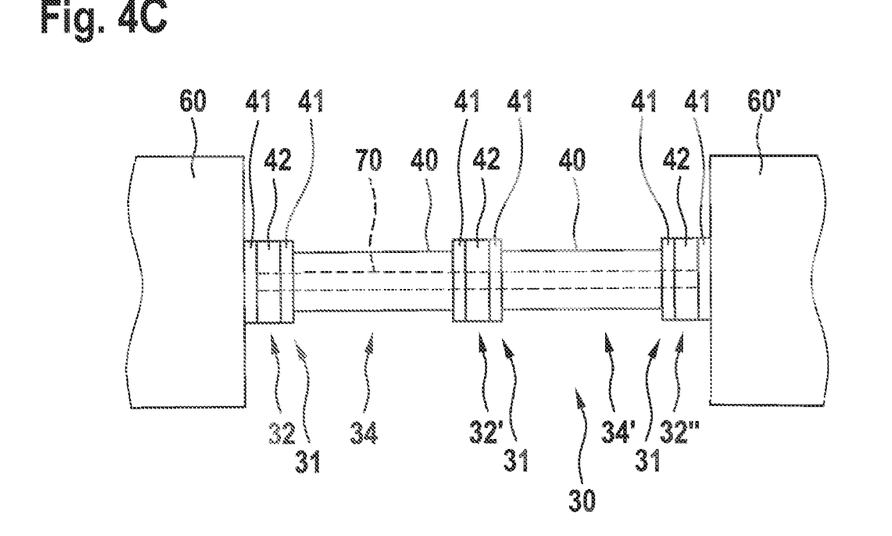

FIG. 4C shows a further variant of the protective apparatus 30, which corresponds to a combination of the variants shown in FIG. 3 and FIG. 4A, that is to say includes three segments 32, 32', 32" of the first partial region 31 and two segments 34, 34' of the second partial region 33. The segments 32, 32', 32" of the first partial region 31 are arranged in each case between a component 60, 60' and a respective segment 34, 34' of the second partial region 33 and between the segments 34, 34'.

Figure 4D:
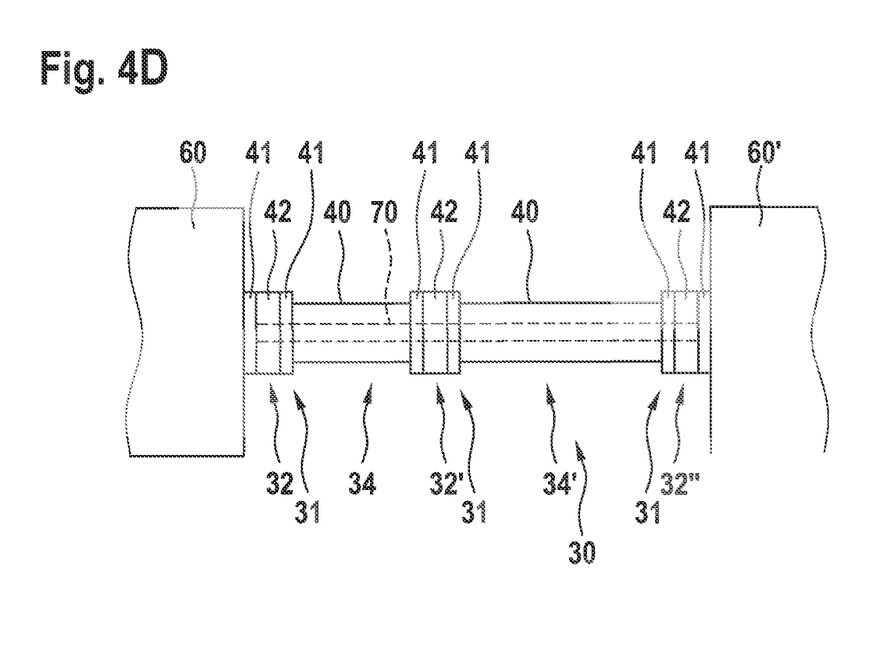

FIG. 4D shows a further variant of the protective apparatus 30, which is designed to be nearly identical in terms of the arrangement of the segments 32, 32', 32", 34, 34' to the protective apparatus 30 shown in FIG. 4C. The two segments 34, 34' of the second partial region 33 here have different lengths, as a result of which the further transmission of mechanical vibrations having a frequency corresponding to the resonant frequency of the first segment 34 is significantly reduced. Due to the resonant frequencies of the segments 34 and 34' deviating from one another owing to the different lengths, mechanical vibrations of the segment 34 are not completely transmitted through the segment 34'. In the case of sound insulation glazing, for example, this effect is achieved by the use of panes having different thicknesses.

Figure 5A:
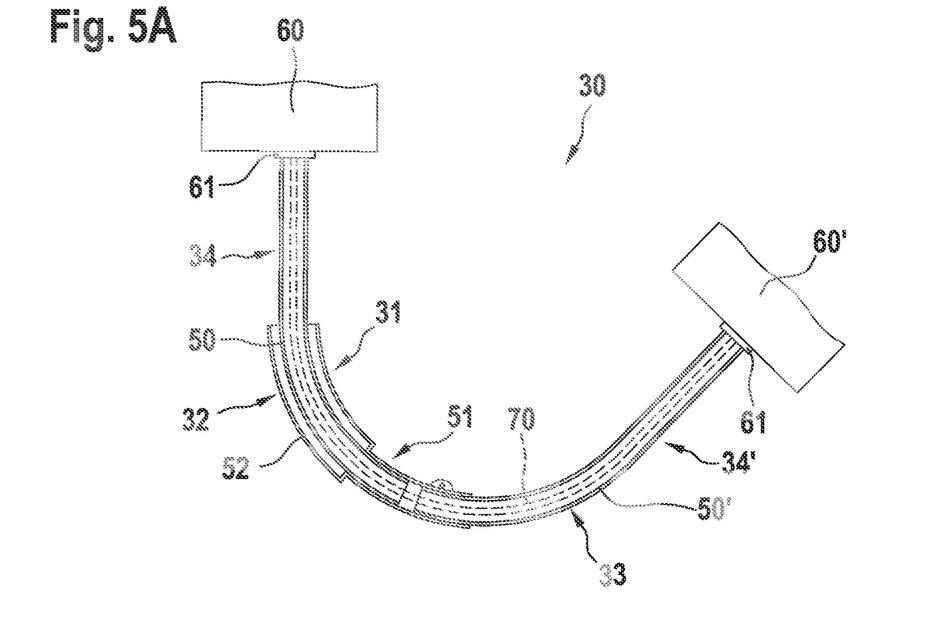
FIGS. 5A-5B show a further embodiment of the disclosure.
Figure 5B:
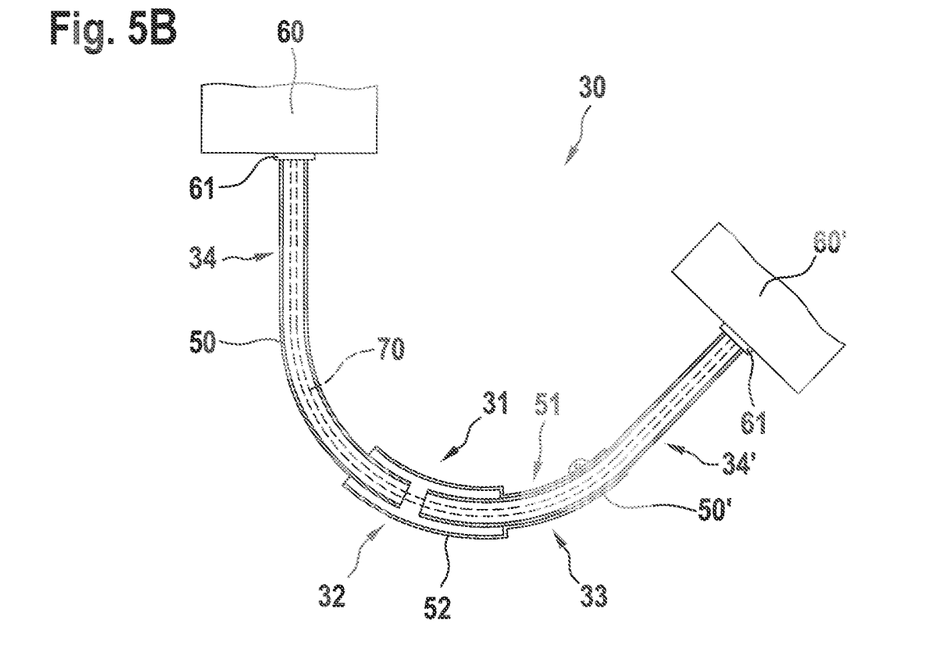

FIGS. 5A and 5B show a further embodiment of the protective apparatus 30. The protective apparatus 30 here includes a segment 32 of the first partial region 31, wherein the segment 32 includes an attachment mechanism 51 and a sleeve 52. The protective apparatus 30 in the example shown furthermore includes two segments 34, 34' of the second partial region 33. The first partial region 31 and the second partial region 33 can here include steel tubes 50, 50'. Moreover, the first partial region 31 from a functional viewpoint also includes the region between the two segments 34, 34' of the second partial region 33.

The position of the first partial region 31 shown in FIG. 5A is used, for example, for the transport or during the setup of the projection exposure apparatus. In this position, the attachment mechanism 51 of the first partial region 31 connects the two segments 34, 34' of the second partial region 33, wherein the attachment mechanism 51 is embodied in the form of a clamping apparatus. The sleeve 52, which is formed like a pipe section, has a larger internal diameter than the attachment mechanism 51 and is firmly connected thereto. The internal diameter is here selected such that the sleeve 52 can be moved over the segments 34, 34' of the second partial region 33 without touching them.

FIG. 5B shows the identical arrangement in a second position, in which the first partial region 31 is attached to only one of the segments 34' of the second partial region 33 by way of the attachment 51. The sleeve 52 encloses the lines 70, which are indicated in dashes, in the region between the two segments 34, 34' of the second partial region 33, in which the lines 70 are not enclosed by tubes 50, 50'. In this region, the sleeve 52 serves to protect the lines 70 against mechanical damage and, with a suitable selection of the internal diameter of the sleeve 52, also to avoid a bend radius falling under a minimum bend radius. In the second position, the region between the two segments 34, 34' of the second partial region 33 makes nearly complete decoupling of the two components, which are connected only via the lines 70, possible.

LIST OF REFERENCE SIGNS

1 Projection exposure apparatus
2 Facet mirror
3 Light source
4 Illumination optical unit
5 Object field
6 Object plane
7 Reticle
8 Reticle holder
9 Projection optical unit
10 Image field
11 Image plane
12 Wafer
13 Wafer holder
14 EUV radiation
15 Intermediate field focal plane
16 Pupil facet mirror
17 Assembly
18 Mirror
19 Mirror
20 Mirror
30 Protective apparatus
31 First partial region
32, 32', 32" Segment of the first partial region
33 Second partial region
34, 34' Segment of the second partial region
40 Corrugated tube
41 Fastening mechanism
42 Bushing
50, 50' Tube
51 Fastening mechanism
52 Sleeve
60, 60' Component
61 Attachment mechanism
70 Line

What is claimed is:

1. A protective apparatus, comprising:
first and second perfluoroelastomer bushings;
multiple corrugated tubes connected to the first and second perfluoroelastomer bushings;
lines running through the first and second perfluoroelastomer bushings and the multiple corrugated tubes;
a first component connected to the first perfluoroelastomer bushing; and
a second component connected to the second perfluoroelastomer bushing,
wherein:
the first and second perfluoroelastomer bushings and the multiple corrugated tubes protect against mechanical damage to the lines;
the first and second perfluoroelastomer bushings at least temporarily mechanically decouple the first component from the second component; and
a ratio of a static stiffness of the first perfluoroelastomer bushing to a static stiffness of at least one of the multiple corrugated tubes is greater than one.

2. The protective apparatus of claim 1, wherein the multiple corrugated tubes have different lengths.

3. The protective apparatus of claim 1, wherein the first perfluoroelastomer bushing is clamped to one of the corrugated tubes.

4. The protective apparatus of claim 1, wherein the first perfluoroelastomer is firmly connected to one of the corrugated tubes.

5. The protective apparatus of claim 1, wherein, in a frequency range of from 500 Hz to 2000 Hz, a ratio of a dynamic stiffness of the first perfluoroelastomer bushing to a dynamic stiffness of the at least one of the corrugated tubes is less than 1/10.

6. The protective apparatus of claim 1, wherein the first and second bushings, the multiple corrugated tubes, and the first and second components are arranged successively according to the following: the first component, the first perfluoroelastomer bushing, the multiple corrugated tubes, the second perfluoroelastomer bushing, and the second component.

7. The protective apparatus of claim 1, wherein the first perfluoroelastomer bushing comprises a tuned mass damper.

8. The protective apparatus of claim 1, wherein materials of the protective apparatus are vacuum-suitable.

9. The protective apparatus of claim 1, wherein the multiple corrugated tubes have different lengths, and the first perfluoroelastomer bushing is clamped to the one of the corrugated tubes.

10. The protective apparatus of claim 1, wherein the multiple corrugated tubes have different lengths, and the first perfluoroelastomer bushing is firmly connected to the one of the corrugated tubes.

11. An apparatus, comprising:
an illumination system configured to illuminate an object field;
a projection optical unit configured to image the object field into an image field; and
a protective apparatus according to claim 1,
wherein the apparatus is a semiconductor lithography projection exposure apparatus.

12. A method of using a semiconductor lithography projection exposure apparatus comprising an illumination system, a projection optical unit and a protective system, the method comprising:
using the illumination system configured to illuminate an object field; and
using the projection optical unit configured to image the object field into an image field,
wherein the protective apparatus is a protective apparatus according to claim 1.

13. The protective apparatus of claim 1, wherein a ratio of the static stiffness of the first perfluoroelastomer bushing to a static stiffness of each of the multiple corrugated tubes is greater than one.

14. The protective apparatus of claim 13, wherein a ratio of a static stiffness of the second perfluoroelastomer bushing to a static stiffness of each of the multiple corrugated tubes is greater than one.

15. The protective apparatus of claim 1, wherein each of the multiple corrugated tubes is between the first and second perfluoroelastomer bushings.

16. The protective apparatus of claim 15, further comprising a third perfluoroelastomer bushing, wherein the third perfluoroelastomer bushing is connected to the multiple corrugated tubes, and the third perfluoroelastomer bushing is between the first and second perfluoroelastomer bushings.

17. A protective apparatus, comprising:
first and second perfluoroelastomer bushings;
multiple corrugated tubes connected to the first and second perfluoroelastomer bushings;
lines running through the first and second perfluoroelastomer bushings and the multiple corrugated tubes;
a first component connected to the first perfluoroelastomer bushing; and
a second component connected to the second perfluoroelastomer bushing,
wherein:
the first and second perfluoroelastomer bushings and the multiple corrugated tubes protect against mechanical damage to the lines;
the first and second perfluoroelastomer bushings at least temporarily mechanically decouple the first component from the second component; and
in a frequency range of from 500 Hz to 2000 Hz, a ratio of a dynamic stiffness of the first perfluoroelastomer bushing to a dynamic stiffness of at least one of the corrugated tubes is less than $1/10$.

18. The protective apparatus of claim 17, wherein in the frequency range of from 500 Hz to 2000 Hz, the ratio of a dynamic stiffness of the first perfluoroelastomer bushing to a dynamic stiffness of each of the corrugated tubes is less than $1/10$.

19. An apparatus, comprising:
an illumination system configured to illuminate an object field;
a projection optical unit configured to image the object field into an image field; and
a protective apparatus according to claim 17,
wherein the apparatus is a semiconductor lithography projection exposure apparatus.

* * * * *

UNITED STATES PATENT AND TRADEMARK OFFICE
CERTIFICATE OF CORRECTION

PATENT NO. : 12,038,695 B2  
APPLICATION NO. : 17/370391  
DATED : July 16, 2024  
INVENTOR(S) : Tobias Hegele Page 1 of 1

It is certified that error appears in the above-identified patent and that said Letters Patent is hereby corrected as shown below:

On the Title Page

Column 2, item (57) Abstract Section, Lines 3-4, please replace "two components. the" with -- two components. The --.

Signed and Sealed this  
Twenty-ninth Day of April, 2025

Coke Morgan Stewart  
*Acting Director of the United States Patent and Trademark Office*